United States Patent
Hsieh et al.

(10) Patent No.: US 10,784,452 B2
(45) Date of Patent: Sep. 22, 2020

(54) FLEXIBLE SUBSTRATE AND MANUFACTURING METHOD THEREOF, MANUFACTURING METHOD OF DISPLAY PANEL AND DISPLAY DEVICE

(71) Applicant: BOE TECHNOLOGY GROUP CO., LTD., Beijing (CN)

(72) Inventors: Mingche Hsieh, Beijing (CN); Jing Yang, Beijing (CN); Yuanzheng Guo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/258,011

(22) Filed: Jan. 25, 2019

(65) Prior Publication Data
US 2019/0305235 A1    Oct. 3, 2019

(30) Foreign Application Priority Data
Mar. 29, 2018    (CN) .......................... 2018 1 0271099

(51) Int. Cl.
*H01L 51/00* (2006.01)
*H01L 27/32* (2006.01)

(52) U.S. Cl.
CPC ...... *H01L 51/0097* (2013.01); *H01L 27/3244* (2013.01); *H01L 2227/323* (2013.01); *H01L 2227/326* (2013.01)

(58) Field of Classification Search
CPC . H01L 51/0097; H01L 51/52; H01L 27/3244; H01L 2227/323; H01L 2227/326; H01L 2251/5338
See application file for complete search history.

(56) References Cited

U.S. PATENT DOCUMENTS

| | | | |
|---|---|---|---|
| 9,632,362 B2 * | 4/2017 | Chiu | G02F 1/133784 |
| 2004/0124763 A1 * | 7/2004 | Nathan | H01L 27/3244 313/498 |
| 2011/0031576 A1 * | 2/2011 | Iwasa | H01L 21/26513 257/440 |
| 2012/0318771 A1 * | 12/2012 | Guo | G02F 1/133305 216/20 |
| 2014/0234468 A1 * | 8/2014 | Taniguchi | G11B 5/855 425/385 |
| 2017/0254518 A1 * | 9/2017 | Vasylyev | G02B 6/0083 |

* cited by examiner

*Primary Examiner* — Joseph C. Nicely
(74) *Attorney, Agent, or Firm* — Nath, Goldberg & Meyer; Joshua B. Goldberg

(57) ABSTRACT

The present disclosure provides a flexible substrate, a method for manufacturing the same, a method for manufacturing a display panel and a display device. The flexible substrate has sub-pixel regions and an inter-subpixel region between adjacent sub-pixel regions. The flexible substrate includes a support layer including a plurality of micro-grooves, and the plurality of micro-grooves are on one side of the support layer and in the inter-subpixel region.

18 Claims, 5 Drawing Sheets

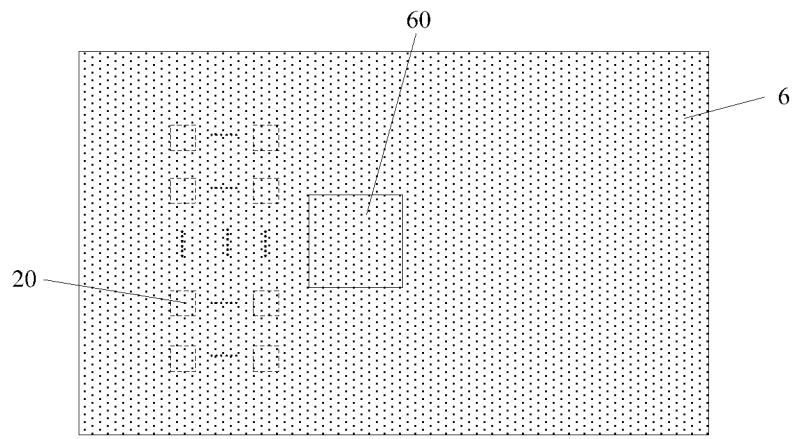
FIG. 4A
| | C | O | Si |
|---|---|---|---|
| PDMS (theoretical value) | 50.0 | 25.0 | 25.0 |
| PDMS (measured value) | 47.1 | 25.1 | 27.7 |
| irradiation for 3 min | 17.2 | 52.0 | 30.8 |
| irradiation for 40 min | 4.0 | 63.0 | 33.0 |
FIG. 4B
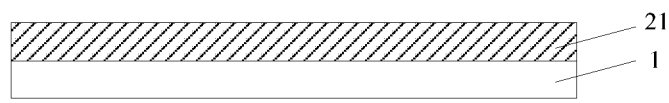
FIG. 5A
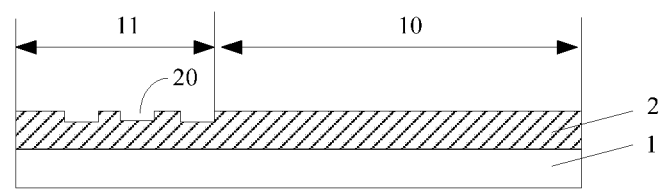
FIG. 5B

FLEXIBLE SUBSTRATE AND MANUFACTURING METHOD THEREOF, MANUFACTURING METHOD OF DISPLAY PANEL AND DISPLAY DEVICE

CROSS-REFERENCE TO RELATED APPLICATION

The present application claims priority to Chinese Patent Application No. 201810271099.7, filed on Mar. 29, 2018, the disclosure of which is hereby incorporated by reference in its entirety.

TECHNICAL FIELD

The present disclosure relates to the field of display technology, more particularly, to a flexible substrate, a method for manufacturing the same, a method for manufacturing a display panel and a display device.

BACKGROUND

With the development of science and technology, flat panel display devices have replaced cumbersome CRT display devices and are widely used in people's daily lives. At present, commonly used flat panel display devices include LCD (Liquid Crystal Display) and OLED (Organic Light-Emitting Diode) display devices. Compared with an LCD device, an OLED display device has the advantages of being self-luminous and flexible, and the like.

In recent years, the flexible display technology has developed rapidly, and various flexible display screen development plans have emerged in an endless stream, involving fields of displays, wearable devices and the like. A flexible display screen is stretchable, and therefore imposes special requirements on its substrate, thin film transistor (TFT), light-emitting device, circuit arrangement and the like.

SUMMARY

The present disclosure provides a flexible substrate, a method for manufacturing the same, a method for manufacturing a display panel, and a display device.

In one aspect, the present disclosure provides a flexible substrate having sub-pixel regions and an inter-subpixel region between adjacent sub-pixel regions, wherein the flexible substrate includes a support layer, the support layer includes a plurality of micro-grooves, and the plurality of micro-grooves are on one side of the support layer and in the inter-subpixel region.

In an embodiment of the present disclosure, the flexible substrate further includes an extension layer, the extension layer is on a side of the support layer where the plurality of micro-grooves are not disposed, and includes a first region and a second region, and an elastic modulus of the first region is greater than an elastic modulus of the second region.

In an embodiment of the present disclosure, the extension layer is made of a material capable of being modified by light irradiation.

In an embodiment of the present disclosure, the extension layer is made of polydimethylsiloxane.

In an embodiment of the present disclosure, the flexible substrate includes a display area and a non-display area, the sub-pixel regions and the inter-subpixel region are in the display area, the non-display area includes a bonding region provided with a contact, and part of the plurality of micro-grooves is located in a region of the non-display area other than the bonding region.

In an embodiment of the present disclosure, the flexible substrate further includes a control element on a side of the support layer distal to the extension layer, wherein the control element is in the sub-pixel region, and an orthographic projection of the control element on the extension layer is within the first region of the extension layer.

In an embodiment of the present disclosure, depths of the micro-grooves are no greater than one tenth of a thickness of the support layer.

In an embodiment of the present disclosure, the micro-grooves are circular grooves or rectangular grooves.

In an embodiment of the present disclosure, the micro-grooves are evenly distributed in the inter-subpixel region.

In an embodiment of the present disclosure, the support layer is made of polyimide.

In another aspect, the present disclosure provides a method for manufacturing a flexible substrate having sub-pixel regions and an inter-subpixel region between adjacent sub-pixel regions, the method including:
providing a support film layer; and
forming a plurality of micro-grooves in the inter-subpixel region on a surface of the support film layer, thereby forming a support layer.

In an embodiment of the present disclosure, the method further includes forming an extension layer on a side of the support layer where the plurality of micro-grooves are not formed, wherein the extension layer includes a first region and a second region, and an elastic modulus of the first region is greater than an elastic modulus of the second region.

In an embodiment of the present disclosure, the extension layer is formed of a material capable of being modified by light irradiation, and the method further includes:
irradiating the first region of the extension layer with ultraviolet light without irradiating the second region of the extension layer such that the elastic modulus of the first region is greater than the elastic modulus of the second region.

In an embodiment of the present disclosure, the flexible substrate includes a display area and a non-display area, the sub-pixel regions and the inter-subpixel region are located in the display area, and the non-display area includes a bonding region provided with a contact; and the method further includes:
forming, in the surface of the support film layer, a plurality of micro-grooves in a region in the non-display area other than the bonding region.

In an embodiment of the present disclosure, the plurality of micro-grooves are formed by at least one of a laser ablation method, a dry etching method, a wet etching method, and a nanoimprint method.

In an embodiment of the present disclosure, forming the plurality of micro-grooves in the inter-subpixel region in the surface of the support film layer includes:
forming a resist layer on the surface of the support film layer;
patterning the resist layer such that the patterned resist layer includes a resist removed region and a resist remaining region;
etching a part of the support film layer corresponding to the resist removed region using an etching medium to form the plurality of micro-grooves; and
removing the resist layer.

In an embodiment of the present disclosure, the method further includes:

forming a control element on a side of the support layer distal to the extension layer, wherein the control element is in the sub-pixel region, and an orthographic projection of the control element on the extension layer is within the first region of the extension layer.

In still another aspect, the present disclosure provides a method for manufacturing a display panel, including:

providing a support layer of the flexible substrate according to the present disclosure on a base substrate;

forming a control element at a corner of the sub-pixel region on a side of the support layer where the micro-grooves are disposed;

forming a light-emitting device in the sub-pixel region on a side of the control element distal to the micro-grooves; and separating the support layer from the base substrate.

In an embodiment of the present disclosure, the method further includes:

transferring the support layer on which the control element and the light-emitting device are formed onto an extension layer, wherein a surface of the support layer where the micro-grooves are not provided is in contact with the extension layer, and an area covered by an orthographic projection of the control element on the extension layer is a first region of the extension layer;

irradiating the first region of the extension layer with ultraviolet light without irradiating a region of the extension layer other than the first region, such that an elastic modulus of the first region is greater than an elastic modulus of the region of the extension layer other than the first region.

In still another aspect, the present disclosure provides a display device including a display panel formed using the method according to the present disclosure.

BRIEF DESCRIPTION OF THE DRAWINGS

FIG. 4A is a schematic plan view of irradiating an extension layer with ultraviolet light to form a reinforcement region;

FIG. 4B illustrates proportions of components in the extension layer (PDMS) before and after the ultraviolet irradiation;

FIG. 5A to 5E illustrate a manufacturing process of a flexible display panel according to an embodiment of the present disclosure;

DETAILED DESCRIPTION

Figure 1A:
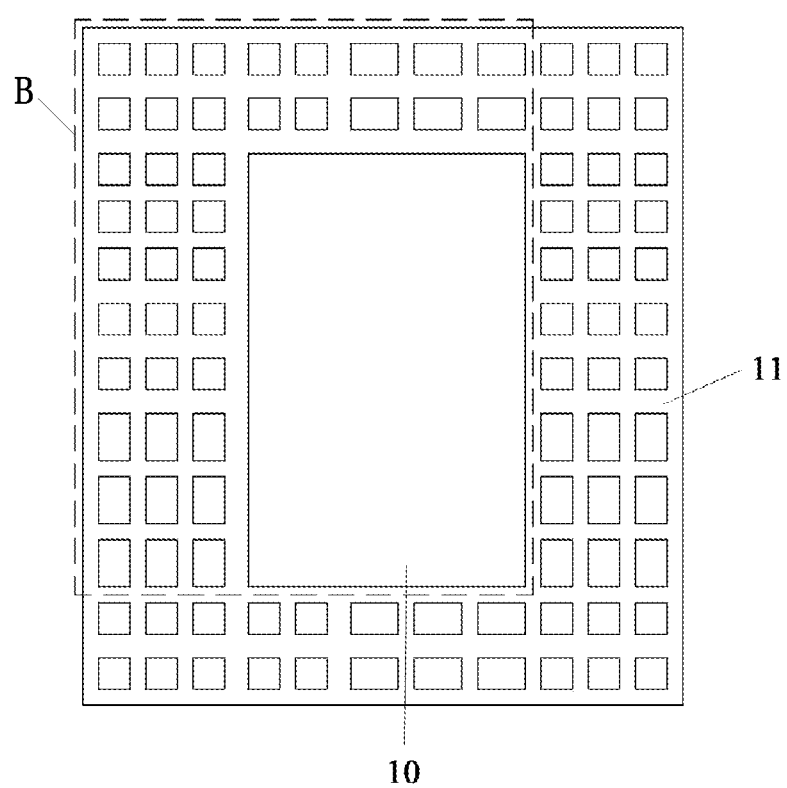
FIG. 1A is a schematic plan view of a part of a flexible substrate according to an embodiment of the present disclosure.

In order to enable those skilled in the art to better understand the technical solutions of the present disclosure, a flexible substrate, a manufacturing method thereof, a manufacturing method of a display panel, and a display device of the present disclosure are further described in detail below with reference to the accompanying drawings and specific implementations.

In a flexible substrate, a thin film transistor is formed on a substrate. In order to adapt to the stretchable property, the thin film transistor is generally formed into a separate island structure to avoid damage to a display device during the stretching. However, in general, since the flexible substrate is relatively thick and has a relatively large elastic modulus, it is difficult to stretch or deform the flexible substrate, and the flexible substrate may even be broken.

Accordingly, the present disclosure provides, inter alia, a flexible substrate, a method for manufacturing a flexible substrate, a method for manufacturing a display panel, and a display device, that substantially obviate one or more of the problems due to limitations and disadvantages of the related art. In one aspect, the present disclosure provides a flexible substrate having sub-pixel regions and an inter-subpixel region between adjacent sub-pixel regions. The flexible substrate includes a support layer including a plurality of micro-grooves, the plurality of micro-grooves are on one side of the support layer and in the inter-subpixel region.

As used herein, the sub-pixel region refers to a light-emitting region of a sub-pixel, such as a region in a liquid crystal display corresponding to a pixel electrode, or a region in an organic light-emitting diode display panel corresponding to a light-emitting layer. In an embodiment, a pixel may include a number of individual light-emitting regions corresponding to a number of sub-pixels in the pixel. Optionally, the sub-pixel region is a light-emitting region of a red sub-pixel. Optionally, the sub-pixel region is a light-emitting region of a green sub-pixel. Optionally, the sub-pixel region is a light-emitting region of a blue sub-pixel. Optionally, the sub-pixel region is a light-emitting region of a white sub-pixel. As used herein, the inter-subpixel region refers to a region between adjacent sub-pixel regions, such as a region in a liquid crystal display corresponding to a black matrix, or a region in an organic light-emitting diode display panel corresponding to a pixel define layer. Optionally, the inter-subpixel region is a region between adjacent sub-pixel regions in a same pixel. Optionally, the inter-subpixel region is a region between two adjacent sub-pixel regions from two adjacent pixels. Optionally, the inter-subpixel region is a region between the sub-pixel region of a red sub-pixel and the sub-pixel region of a green sub-pixel adjacent to the red sub-pixel. Optionally, the inter-subpixel region is a region between the sub-pixel region of a red sub-pixel and the sub-pixel region of a blue sub-pixel adjacent to the red sub-pixel. Optionally, the inter-subpixel region is a region between the sub-pixel region of a green sub-pixel and the sub-pixel region of a blue sub-pixel adjacent to the green sub-pixel.

Figure 1B:
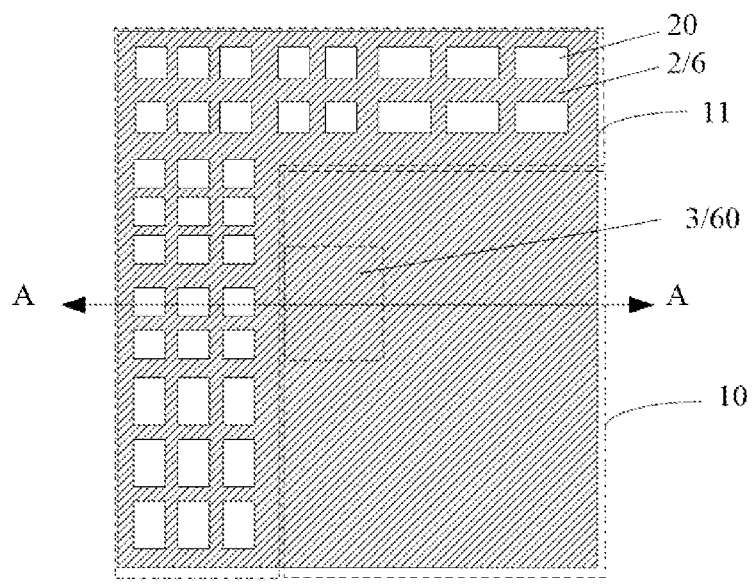
FIG. 1B is a partially enlarged view of portion B of the flexible substrate shown in FIG. 1A.
Figure 2:
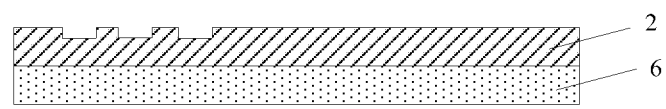
FIG. 2 is a cross-sectional view taken along line AA of the flexible substrate shown in FIG. 1B.

FIG. 1A is a schematic plan view of a part of a flexible substrate according to an embodiment of the present disclosure; FIG. 1B is a partially enlarged view of portion B of the flexible substrate shown in FIG. 1A; and FIG. 2 is a cross-sectional view taken along line AA of the flexible substrate shown in FIG. 1B.

A flexible substrate according to an embodiment of the present disclosure is configured to bear a flexible display device. As shown in FIG. 1A, the flexible substrate has sub-pixel regions 10 and an inter-subpixel region 11 between adjacent sub-pixel regions. As shown in FIGS. 1A, 1B and 2, the flexible substrate includes a support layer 2 including a plurality of micro-grooves 20, and the plurality of micro-grooves 20 are on one side of the support layer 2 and in the inter-subpixel region 11. The flexible substrate according to the embodiment of the present disclosure can provide sufficient ductility while ensuring support performance. In the case of using the flexible substrate to form a display panel, the micro-grooves 20 are provided on a side of the support layer 2 where the flexible display device is to be disposed, that is, the openings of the micro-grooves 20 face the flexible display device. In the flexible substrate, due to the presence of the micro-grooves 20, a concave and convex structure having non-uniform thicknesses is formed on the side of the support layer 2. Under the action of a same external force, a region having a smaller thickness is stretched more easily, and can absorb stress more easily. As such, stress is prevented from accumulating in the sub-pixel regions to cause damage to the structure in the sub-pixel regions. Therefore, by having the micro-grooves 20 in the inter-subpixel region 11 of the flexible substrate, the stress is offset by material deformation in the inter-subpixel region, thereby cancelling out impact of the stress and preventing the sub-pixel regions from being damaged by the stress.

In some embodiments, the flexible substrate further includes an extension layer 6 on a side of the support layer 2 on which the micro-grooves 20 are not provided. In an embodiment, the extension layer 6 is made of a material that can be modified by light irradiation. The purpose of modification by light irradiation is to increase the elastic modulus of a material, making the material less deformable. By providing the extension layer 6, which can be partially modified, on the side of the support layer 2 where the micro-grooves 20 are not provided, sufficient support performance is provided for a portion or region having a specific requirement while ensuring ductility.

In some embodiments, the flexible substrate further includes a control element 3 located within the sub-pixel region 10 and on a side of the support layer 2 distal to the extension layer 6.

Generally, the flexible display device is supported by the support layer of the flexible substrate, each sub-pixel region 10 is provided therein with the control element 3, a region of the extension layer 6 corresponding to the control element 3 is modified by light into a reinforcement region 60 (in the plan view of FIG. 1B, the reinforcement region 60 overlaps with the region where the control element 3 is located), and the elastic modulus of the reinforcement region 60 is greater than the elastic modulus of a region of the extension layer 6 other than the reinforcement region 60. The control element 3, as a core element for controlling display of the pixel, typically cannot be stretched to avoid damage thereto and influence on the performance of the control element 3.

As shown in FIG. 1B, the control element 3 is generally disposed at a corner of the sub-pixel region 10, for example, near the edge of the sub-pixel region 10 and close to the inter-subpixel region 11, and alternatively, the control element may be disposed throughout the entire sub-pixel region, which is not limited. With the above design, the inter-subpixel region 11 is provided with the micro-grooves 20 to have good ductility, and at the same time, the region (second region) of the extension layer 6 other than the reinforcement region 60 (first region) corresponding to the control element 3 is not modified by light, and thus still has good ductility, thereby ensuring the stretchable property of the entire flexible substrate. At the same time, the reinforcement region 60 has increased hardness and is not easily deformed after being modified by light. Therefore, the control element 3 on the reinforcement region 60 is less likely to be deformed, so that the performance of the control element 3 can be effectively ensured.

In some embodiments, the control element 3 is a thin film transistor (TFT), and is configured to, for example, provide a display control signal to the pixel. The thin film transistor includes a gate, a source and a drain. For example, a scan signal is received by the gate, a display data signal is received by the source, and then the display data signal is output to an anode of a light-emitting device 4 (e.g., an organic light-emitting diode; OLED for short) through the drain to control light emission of the light-emitting device 4. The region of the extension layer 6 that does not undergo light modification is soft and has good stretchability, and the region of the extension layer 6 that undergoes light modification is relatively hard and can maintain the characteristics of the thin film transistor. In addition, since the inter-subpixel region is provided with the micro-grooves 20, stress can be released at positions in the grooves having a relatively small thickness during stretching, so that bending or stretching can be easily achieved, and damage due to accumulation of stress can hardly be caused to the flexible substrate.

It should be understood here that in the sub-pixel region 10, a region, other than the region where the thin film transistor is disposed, may be patterned to have a groove without affecting the electrical performance of the thin film transistor. Comprehensively considering deformation of the pixel structure, the light-emitting area and mixing effect of different colors, a micro-groove may be formed in the sub-pixel region, so as to provide more regions for releasing stress, which facilitates improving the stretchability and bendability of the flexible substrate, making the flexible substrate have better ductility.

The display control signals supplied to the control element 3 include a scan signal and a display data signal. Each control element 3 is connected to a gate line and a data line, respectively, and the scan signal is transmitted through a scan line or a gate line, and the display data signal is transmitted through a data line. In the flexible substrate of the embodiment, the gate line and the data line are disposed in the inter-subpixel region 11 between adjacent sub-pixel regions 10. The inter-subpixel region 11 undergoes large deformation when stretching the flexible substrate, so as to release stress. Since the gate line and the data line are mainly made of a metal material, which has relatively good ductility and bendability, they can hardly be damaged when stretching and bending the flexible substrate.

Since the region having a small thickness has good ductility and poor support performance, depths of the micro-grooves 20 can be reasonably set in practical applications. In an embodiment, the depths of the micro-grooves 20 are no greater than one tenth of the thickness of the support layer 2. The micro-grooves 20 having a thickness in this range can achieve a good balance between ductility and support performance.

In some embodiments, as shown in FIG. 1B, the micro-grooves 20 are circular grooves or rectangular grooves. The above shapes of the micro-grooves 20 can ensure convenience of process and obtain high process yield. In a practical process, a wall thickness between the circular grooves is larger; however, the rectangular groove has a larger grooved area, which is more conducive to deformation and stress release.

In an embodiment, the micro-grooves 20 are evenly distributed in the inter-subpixel region 11 between adjacent sub-pixel regions 10 to ensure uniformity of stress release.

In some embodiments, the flexible substrate includes a display area and a non-display area, the sub-pixel regions and the inter-subpixel region are located in the display area, the non-display area includes a bonding region provided with a contact, and a plurality of micro-grooves are provided in a region, other than the bonding region, in the non-display area.

In some embodiments, the support layer 2 is made of polyimide and the extension layer 6 is made of polydimethylsiloxane (PDMS for short). PDMS has good stretchability and can be used as a back film material for a stretchable display. After PMDS is irradiated with ultraviolet light (UV), its components change, and it becomes hard and can hardly be deformed. The region of the extension layer 6 that is irradiated with ultraviolet light and the region of the extension layer 6 that is not irradiated with ultraviolet light correspond to the reinforcement region and the non-reinforcement region, respectively, and stress can be released in the non-reinforcement region. The materials of the support layer 2 and the extension layer 6 are easily obtained, which is advantageous for reducing cost.

In another aspect, embodiments of the present disclosure also provide a method for manufacturing the flexible substrate. The flexible substrate may be used to bear a flexible display device. The flexible substrate has sub-pixel regions 10 and an inter-subpixel region 11 between adjacent sub-pixel regions. The flexible substrate includes a support layer 2 including a plurality of micro-grooves 20, and the plurality of micro-grooves 20 are located on one side of the support layer 2 and in the inter-subpixel region 11. By providing the micro-grooves 20 in a region of the support layer 2 corresponding to the inter-subpixel region 11, sufficient ductility can be provided while ensuring support property.

Figure 3A:
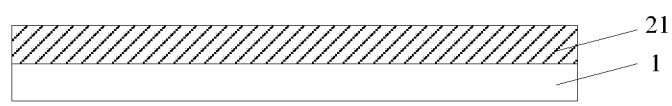
FIGS. 3A to 3C illustrate a manufacturing process of a flexible substrate according to an embodiment of the present disclosure.
Figure 3B:
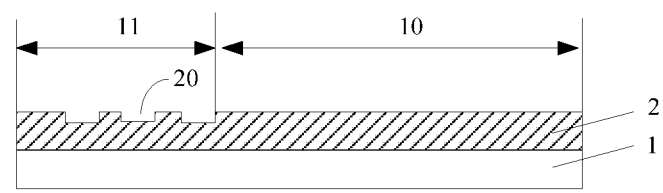
Figure 3C:
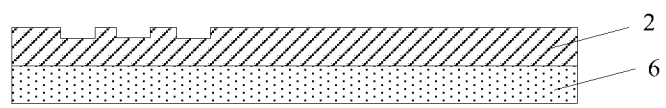

FIGS. 3A to 3C illustrate steps in a method for manufacturing a flexible substrate according to an embodiment of the present disclosure.

As shown in FIG. 3A, a support film layer 21 is provided on a base substrate 1.

As shown in FIG. 3B, a plurality of micro-grooves are formed in a part, corresponding to the inter-subpixel region, of a surface of the support film layer 21, thereby forming a support layer. For example, a plurality of micro-grooves 20 are formed in a part, corresponding to the inter-subpixel region 11 between adjacent sub-pixel regions 10, of a surface of the support film layer 21 by using at least one of: a laser ablation method, a dry etching method, a wet etching method, and a nanoimprint method.

In some embodiments, the step of forming the plurality of micro-grooves 20 includes:

forming a resist layer on the surface of the support film layer 21, the resist layer being formed of, for example, SiOx material;

patterning the resist layer such that the patterned resist layer includes a resist removed region and a resist remaining region;

etching a part of the support film layer 21 corresponding to the resist removed region by using an etching medium to form the micro-grooves 20; for example, performing wet etching by using an etching solution, or performing dry etching by using an etching gas; and removing the resist layer.

In some embodiments, as shown in FIG. 3C, the manufacturing method further includes forming an extension layer 6 on a side of the support layer 2 where the plurality of micro-grooves 20 are not formed, thereby providing sufficient ductility while ensuring support property. The extension layer 6 is formed of a material that can be modified by light. The surface layer of the extension layer 6 is modified by patterned ultraviolet light irradiation, that is, part of the surface of the extension layer 6 is irradiated with light, and the other part of the surface is not irradiated by light. In this way, the extension layer 6 is patterned such that the region subjected to the light irradiation is relatively hard, while the part of the extension layer 6 corresponding to the area of the micro-grooves still has relatively good ductility.

In some embodiments, the manufacturing method further includes forming a control element 3 on a side of the support layer 2 distal to the extension layer 6, the control element 3 being within the sub-pixel region 10. In an embodiment, the manufacturing method further includes: as shown in FIG. 4A, irradiating a part, corresponding to the control element 3, of the surface of the extension layer 6 distal to the support layer 2 with ultraviolet light such that the part of the extension layer 6 corresponding to the control element 3 is modified by light to form a reinforcement region 60 having an elastic modulus greater than that of other region than the reinforcement region 60. For example, main components of the material PDMS of the extension layer 6 are C, O and Si. FIG. 4B shows proportions of components in the extension layer (PDMS) before and after ultraviolet light irradiation. As shown in FIG. 4B, according to the detection result of X-ray photoelectron spectroscopy (XPS), as the irradiation time of ultraviolet light increases, a content of C in the reinforcement region 60 decreases, a content of O increases, and a large amount of SiOx, which is hard and does not deform, is formed. The reinforcement region 60 is formed by partially modifying the extension layer 6, and the reinforcement region 60 is used to ensure the performance of the control element 3 located thereon.

It should be understood herein that all regions except the region corresponding to the micro-grooves of the extension layer 6 may be modified by ultraviolet light irradiation. On the one hand, ductility is improved by the micro-grooves of the support layer 2, and on the other hand, support performance is enhanced by the light modification of the extension layer 6, which facilitate improving the stretchability and bendability of the flexible substrate.

In the flexible substrate of the present embodiment, a part of the support layer in the inter-subpixel region is patterned to form micro-grooves, so that the support layer and a trace thereabove have a convex and concave structure, and a part of the support layer corresponding to the control element is not provided with the micro-groove, and a part of the extension layer corresponding to the control element is treated to be relatively hard, thereby obtaining a stretchable flexible substrate, which is particularly suitable for supporting a flexible display device.

According to an embodiment of the present disclosure, the flexible substrate includes a display area and a non-display area in the periphery of the display area. The sub-pixel regions and the inter-subpixel region are located in the display area, the non-display area includes a bonding region, and a part, in the non-display area but not in the bonding region, of the support layer is provided thereon with a plurality of micro-grooves 20.

In an embodiment, in the region, other than the bonding region, in the non-display area, the plurality of micro-grooves 20 are evenly distributed. In an embodiment, the plurality of micro-grooves 20 have a larger density in a region near the edge than in an intermediate region. In an embodiment, among the plurality of micro-grooves 20, the size of the micro-groove 20 near the edge is larger than the size of the micro-groove 20 in the intermediate region. In the present disclosure, the size relationship of the plurality of micro-grooves 20 is not limited thereto, as long as it is convenient to provide a trace in the inter-subpixel region. Under the action of a same stress, the region having a smaller thickness has better ductility, and the surface area of the micro-groove increases upon application of a force. Here, the edge is defined as a region where an external tensile force is applied for the purpose of stretching, and the intermediate region is defined as a region distal to a point of force application.

In the method for manufacturing the flexible substrate according to the embodiment of the present disclosure, since the flexible display substrate further includes the non-display area located in the periphery of the display area, a bonding region is provided in the non-display area, and the manufacturing method includes: in the step of forming the plurality of micro-grooves 20 in the inter-subpixel region 11, also forming a plurality of micro-grooves 20 in a region, other than the bonding region and in the non-display region, of the surface of the support layer 2 by using laser ablation or dry etching, (the micro-grooves 20 in the inter-subpixel region and the micro-grooves 20 in the non-display region may be formed simultaneously), and the specific manufacturing method may refer to the foregoing embodiments. A contact is provided in the bonding region, and a signal is transmitted between the contact and a signal point of a driving control board. The micro-groove is not provided in a region corresponding to the bonding region, so as to ensure the support performance of the region, and ensure accurate alignment between the contact and the signal point.

In the flexible substrate of the embodiment, the support layer is patterned in both the display area and the non-display area to form micro-grooves, which ensures the ductility of the flexible substrate as a whole, and provides a good support system for flexible display.

In another aspect, embodiments of the present disclosure provide a method for manufacturing a display panel. In some embodiments, the display panel is a flexible display panel.

The flexible substrate described above is part of the flexible display panel. FIGS. 5A to 5E illustrate a manufacturing process of a flexible display panel according to an embodiment of the present disclosure.

First, as shown in FIG. 5A, a support film layer 21 of the above-described flexible substrate is disposed on a base substrate 1. The support film layer 21 is disposed on the base substrate 1, and the support film layer 21 is patterned (by a depth less than 500 Å) using laser etching to form the micro-grooves 20 shown in FIG. 5B, and the micro-grooves 20 are distributed all over a region of the support layer 2 corresponding to the inter-subpixel region 11.

Figure 5C:
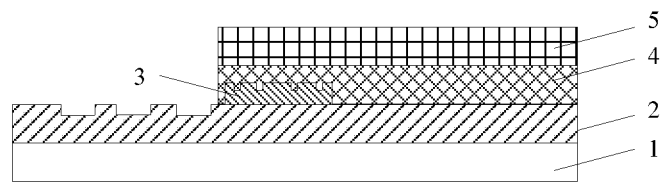
Figure 6A:
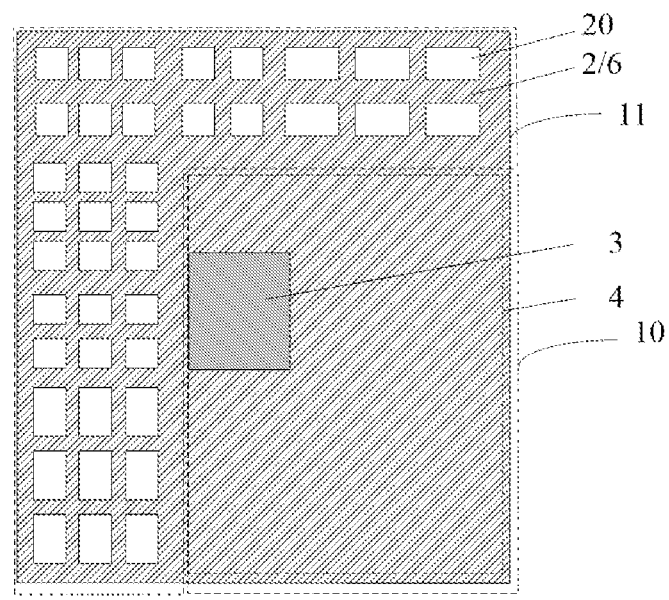
FIG. 6A is a schematic plan view of the structure shown in FIG. 5C.

Next, as shown in FIG. 5C, a control element is formed on the side of the support layer 20 where the micro-grooves are provided, and the control element is in the sub-pixel region 10. In FIGS. 5C and 6A, the control element 3 is formed on the support layer 2, and located at a corner of the sub-pixel region 10. Further, a light-emitting device 4 is formed in the sub-pixel region 10 on a side of the control element 3 distal to the micro-grooves 20. In an embodiment, in the step of forming the control element 3, the gate line and the data line are simultaneously formed in the inter-subpixel region 11 between adjacent sub-pixel regions 10. By providing micro-grooves in the inter-subpixel region 11 between adjacent sub-pixel regions 10, the ductility is improved, and sufficient support in each sub-pixel region is ensured, thereby ensuring independence, flexibility and ductility of each sub-pixel region. In an embodiment, an encapsulation layer 5 is formed on a side of the light-emitting device 4 distal to the control element 3.

Figure 5D:
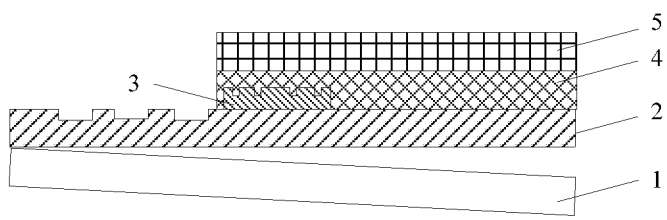

Next, the support layer is separated from the base substrate. As shown in FIG. 5D, the support layer 2 is irradiated with laser from the side of the support layer 2 where the control element 3 is not provided, so as to separate the support layer 2 from the base substrate 1.

Figure 5E:
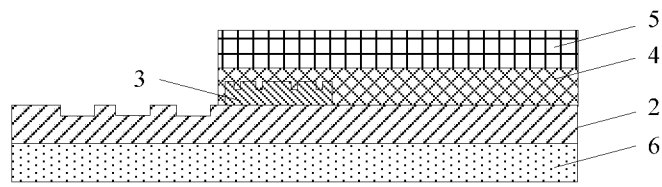

Then, the support layer on which the control element and the light-emitting device are formed is transferred onto the extension layer such that the surface of the support layer where the micro-grooves are not provided is in contact with the extension layer. As shown in FIG. 5E, the extension layer 6 is formed on a back surface of the support layer 2 with the control element 3, the light-emitting device 4, and the encapsulation layer 5, i.e., a surface, on which the control element 3, the light-emitting device 4, and the encapsulation layer 5 are not formed, of the support layer 2. Alternatively, the support layer 2 on which the control element 3, the light-emitting device 4 and the encapsulation layer 5 are formed is transferred onto the extension layer 6. Since the support layer 2 has been separated from the base substrate 1 at this time, the support layer 2 can be picked up by hand or a machine and attached to an extension layer 6 with an adhesive, so that the support layer 2 as well as the control element 3 and the light-emitting device 4 thereon are transferred onto the extension layer 6.

Figure 6B:
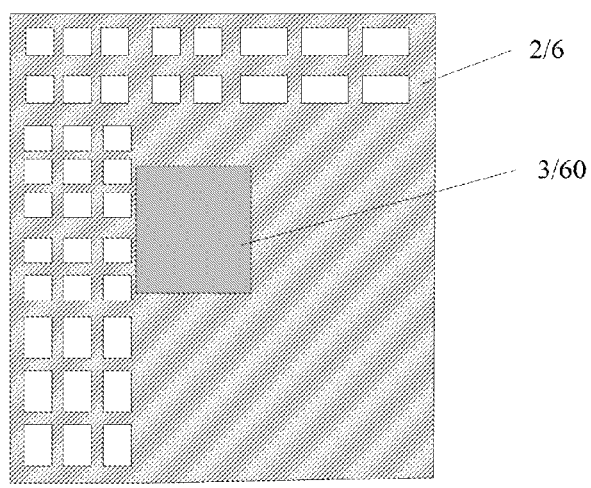
FIG. 6B is a schematic plan view of the structure shown in FIG. 5E.

Finally, a region of the extension layer corresponding to the control element is modified by light irradiation from the side of the extension layer distal to the support layer to form a reinforcement region, and the elastic modulus of the reinforcement region is greater than the elastic modulus of the region other than the reinforcement region. As shown in FIG. 6B, the region of the extension layer 6 corresponding to the control element 3 is irradiated with ultraviolet light from the side of the extension layer 6 distal to the support layer 2, so that the region of the extension layer 6 corresponding to the control element 3 forms the reinforcement region 60, and the elastic modulus of the reinforcement region 60 is greater than the elastic modulus of the region other than the reinforcement region 60.

By modifying the extension layer by light irradiation, the region of the extension layer corresponding to the control element (e.g., a thin film transistor) is formed into SiOx, which is relatively hard, thereby providing support property while ensuring sufficient ductility.

In still another aspect, embodiments of the present disclosure provide a display device including a display panel manufactured using the method according to the embodiments of the present disclosure, and the display device has relatively good flexibility.

The display device may be any product or component having display function, such as a desktop computer, a tablet computer, a notebook computer, a mobile phone, a PDA, a GPS, an on-board display, a projection display, a camera, a digital camera, an electronic watch, a calculator, an electronic instrument, a meter, a LCD panel, an electronic paper, a television, a display, a digital photo frame, a navigator, etc., and can be applied to many fields such as public display and unreal display.

It could be understood that the foregoing implementations are merely exemplary implementations for explaining the principles of the present disclosure, but the present disclosure is not limited thereto. Various modifications and improvements may be made by those skilled in the art without departing from the spirit and scope of the present disclosure, and the modifications and improvements are also considered to be within the scope of the disclosure.

What is claimed is:

1. A flexible substrate having sub-pixel regions and an inter-subpixel region between adjacent sub-pixel regions, wherein the flexible substrate comprises a support layer, the support layer comprises a plurality of micro-grooves, and the plurality of micro-grooves are on one side of the support layer and in the inter-subpixel region, and the flexible substrate comprises a display area and a non-display area, the sub-pixel regions and the inter-subpixel region are in the display area, the non-display area comprises a bonding region provided with a contact, and part of the plurality of micro grooves is in a region of the non-display area other than the bonding region.

2. The flexible substrate of claim 1, further comprising an extension layer, wherein the extension layer is on a side of the support layer where the plurality of micro-grooves are not disposed, and comprises a first region and a second region, an elastic modulus of the first region being greater than an elastic modulus of the second region.

3. The flexible substrate of claim 2, wherein the extension layer is made of a material capable of being modified by light irradiation.

4. The flexible substrate of claim 3, wherein the extension layer is made of polydimethylsiloxane.

5. The flexible substrate of claim 2, further comprising a control element on a side of the support layer distal to the extension layer, wherein the control element is in the sub-pixel region, and an orthographic projection of the control element on the extension layer is within the first region of the extension layer.

6. The flexible substrate of claim 1, wherein depths of the micro-grooves are no greater than one tenth of a thickness of the support layer.

7. The flexible substrate of claim 1, wherein the micro-grooves are circular grooves or rectangular grooves.

8. The flexible substrate of claim 1, wherein the micro-grooves are evenly distributed in the inter-subpixel region.

9. The flexible substrate of claim 1, wherein the support layer is made of polyimide.

10. A method for manufacturing a display panel, comprising:

providing the support layer of the flexible substrate of claim 1 on a base substrate;

forming a control element in the sub-pixel region on a side of the support layer where the micro-grooves are disposed;

forming a light-emitting device in the sub-pixel region on a side of the control element distal to the micro-grooves; and separating the support layer from the base substrate.

11. The method of claim 10, further comprising:

transferring the support layer on which the control element and the light-emitting device are formed onto an extension layer, wherein a surface of the support layer where the micro-grooves are not provided is in contact with the extension layer, and an area covered by an orthographic projection of the control element on the extension layer is a first region of the extension layer; and irradiating the first region of the extension layer with ultraviolet light without irradiating a region of the extension layer other than the first region such that an elastic modulus of the first region is greater than an elastic modulus of the region of the extension layer other than the first region.

12. A display device, comprising the display panel formed using the method of claim 10.

13. A method for manufacturing a flexible substrate, the flexible substrate having sub-pixel regions and an inter-subpixel region between adjacent sub-pixel regions, the method comprising:

providing a support film layer; and forming a plurality of micro-grooves in the inter-subpixel region on a surface of the support film layer, thereby forming a support layer, wherein the flexible substrate comprises a display area and a non-display area, the sub-pixel regions and the inter-subpixel region are located in the display area, and the non-display area comprises a bonding region provided with a contact; and the method further comprises:

forming, in the surface of the support film layer, a plurality of micro-grooves in a region in the non-display area other than the bonding region.

14. The method of claim 13, further comprising forming an extension layer on a side of the support layer where the plurality of micro-grooves are not formed, wherein the extension layer comprises a first region and a second region, and an elastic modulus of the first region is greater than an elastic modulus of the second region.

15. The method of claim 14, wherein the extension layer is formed of a material capable of being modified by light irradiation, and the method further comprises:

irradiating the first region of the extension layer with ultraviolet light without irradiating the second region of the extension layer such that the elastic modulus of the first region is greater than the elastic modulus of the second region.

16. The method of claim 14, further comprising:

forming a control element on a side of the support layer distal to the extension layer, wherein the control element is in the sub-pixel region, and an orthographic projection of the control element on the extension layer is within the first region of the extension layer.

17. The method of claim 13, wherein the plurality of micro-grooves are formed by at least one of a laser ablation method, a dry etching method, a wet etching method, and a nanoimprint method.

18. The method of claim 13, wherein forming the plurality of micro-grooves in the inter-subpixel region in the surface of the support film layer comprises:

forming a resist layer on the surface of the support film layer;

patterning the resist layer such that the patterned resist layer comprises a resist removed region and a resist remaining region;

etching a part of the support film layer corresponding to the resist removed region using an etching medium to form the plurality of micro-grooves; and removing the resist layer.

* * * * *